United States Patent [19]

Loving, Jr. et al.

[11] 4,224,586
[45] Sep. 23, 1980

[54] MONOLITHIC CRYSTAL FILTER HAVING A PASSBAND SYMMETRICAL ABOUT A CENTER FREQUENCY

[75] Inventors: Robert O. Loving, Jr., Streamwood; Ralph A. Kamin, Jr., Elk Grove, both of Ill.

[73] Assignee: Motorola, Inc., Schaumburg, Ill.

[21] Appl. No.: 950,201

[22] Filed: Oct. 10, 1978

[51] Int. Cl.$^3$ .................... H03H 9/56; H03H 9/58; H03H 9/205

[52] U.S. Cl. .................... 333/192; 333/191

[58] Field of Search .................... 333/187–192

[56] References Cited

U.S. PATENT DOCUMENTS

| | | | |
|---|---|---|---|
| 2,198,684 | 4/1940 | Sykes | 333/188 |
| 2,271,870 | 2/1942 | Mason | 333/187 |
| 3,564,463 | 2/1971 | Beaver et al. | 333/191 |
| 3,716,808 | 2/1973 | Malinowski et al. | 333/192 |
| 4,099,149 | 7/1978 | Yee | 333/188 |

*Primary Examiner*—Marvin L. Nussbaum

*Attorney, Agent, or Firm*—Rolland R. Hackbart; James W. Gillman

[57] ABSTRACT

A monolithic crystal filter includes a monolithic crystal filter element, a capacitive network connected in series with the monolithic crystal filter element and a bridging capacitor connected across the monolithic crystal element and the capacitive network. The monolithic crystal filter provides a passband that is symmetrically located about the passband center frequency. The monolithic crystal filter element has two pairs of electrodes that resonate at substantially the same frequency. The resonating frequencies of the electrode pairs are preferably below the passband center frequency. The capacitive circuit raises the resonating frequency of one of the electrode pairs such that the geometric mean of the raised and non-raised electrode-pair frequencies is substantially the same as the passband center frequency. The monolithic crystal filter can be cascaded with one or more similar monolithic crystal filters or monolithic crystal filter elements to obtain greater selectivity.

16 Claims, 4 Drawing Figures

U.S. Patent
Sep. 23, 1980
4,224,586
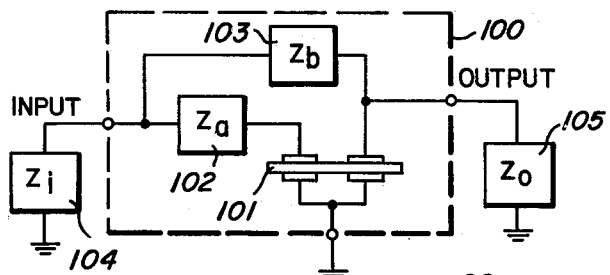
FIG. 1
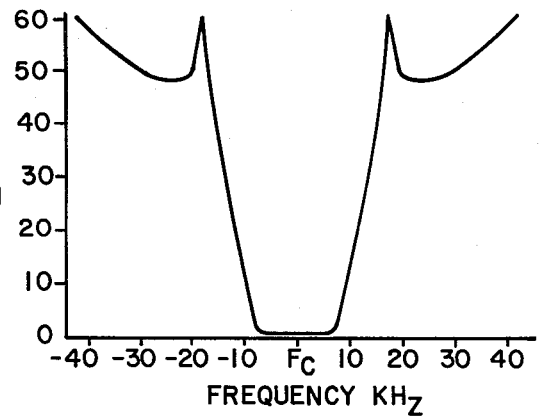
FIG. 2
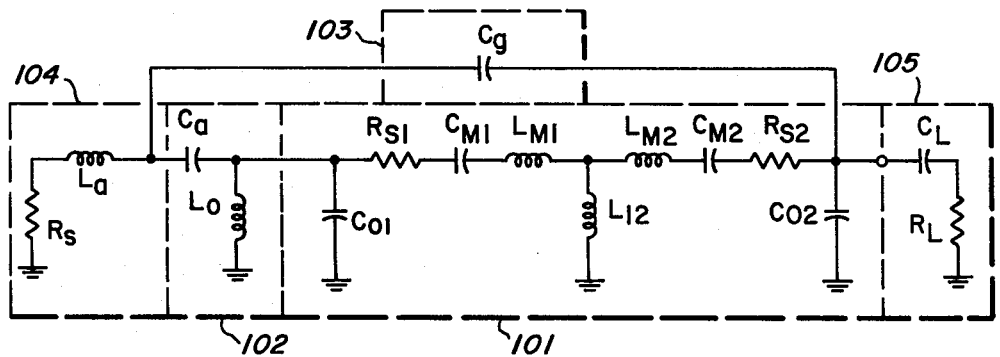
FIG. 3
FIG. 4
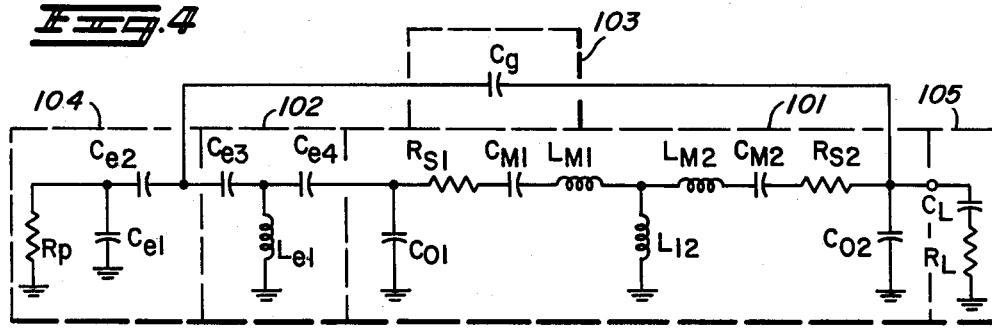

MONOLITHIC CRYSTAL FILTER HAVING A PASSBAND SYMMETRICAL ABOUT A CENTER FREQUENCY

TECHNICAL FIELD

The present invention relates generally to crystal filters, and more particularly, to monolithic crystal filters.

BACKGROUND ART

The design and operating characteristics of monolithic crystal filters are basically described in U.S. Pat. No. 3,564,463. The aforementioned patent further describes the use of bridging capacitors connected between the input and output electrodes of the monolithic crystal filter element for increasing the passband selectivity of a monolithic crystal filter. For applications where it is desirable to have even further passband selectivity, two or more monolithic crystal filter elements with bridging capacitors may be cascaded. Such an arrangement of monolithic crystal filter elements is useful in the IF line up of radio receivers. In order to facilitate the interconnection of monolithic crystal filter elements, the resonating frequencies of the electrode pairs on the monolithic crystal filter elements are selected to be below the passband center frequency so that capacitive coupling may be utilized between successive monolithic crystal filter elements. However, the frequency response of these monolithic crystal filters is not symmetrically located with respect to the passband center frequency. This creates problems in applications, such as in highly selective radio receivers, where symmetrical selectivity is important.

In U.S. Pat. No. 3,716,808, the frequency response of a monolithic crystal filter with a bridging capacitor has been rendered symmetrical with respect to the passband center frequency by constructing the monolithic crystal filter element such that the resonating frequency of one electrode pair is higher than the resonating frequency of the other electrode pair. However, monolithic crystal filter elements having electrode pairs with different precisely controlled frequencies are more difficult to manufacture than, and consequently more expensive than, monolithic crystal filter elements having electrode pairs with identical frequencies.

SUMMARY OF THE INVENTION

It is a general object of the present invention to provide an improved monolithic crystal filter that has a passband symmetrically located with respect to the passband center frequency.

It is another object of the present invention to provide a monolithic crystal filter having a symmetrical passband, that includes a monolithic crystal filter element having two electrode pairs with substantially identical resonating frequencies.

It is a further object of the present invention to provide a monolithic crystal filter that includes a monolithic crystal filter element having two electrode pairs with substantially identical resonating frequencies, wherein one of the electrode-pair frequencies is shifted by a series impedance to render the filter passband symmetrical about the passband center frequency.

In practicing the present invention, a monolithic crystal filter for passing a predetermined passband of frequencies having a predetermined passband center frequency includes a monolithic crystal filter element, a series impedance connected to the monolithic crystal filter element and a bridging impedance connected across the monolithic crystal filter element and the series impedance. The monolithic crystal filter element has two pairs of acoustically coupled electrodes which resonate at substantially the same frequency. The series impedance is connected to one of the electrode pairs for adapting the resonating frequency of the respective electrode pair so that the geometric mean of the adapted and non-adapted electrode-pair resonating frequencies is substantially the same as the passband center frequency. The bridging impedance is connected between the non-adapted electrode pair of the monolithic crystal filter element and the series impedance for providing symmetrically located stopbands above and below the filter passband. The monolithic crystal filter provides an improved frequency response which has relatively steep and symmetrical skirts in the filter stopbands.

BRIEF DESCRIPTION OF THE DRAWINGS

FIG. 1 is a generalized circuit diagram of a monolithic crystal filter embodying the present invention.

FIG. 2 is a frequency response for the monolithic crystal filter of FIG. 1 cascaded with another monolithic crystal filter element.

FIG. 3 is a detailed circuit diagram of the monolithic crystal filter of FIG. 1.

FIG. 4 is a circuit diagram derived from the circuit diagram of FIG. 3.

DETAILED DESCRIPTION OF THE INVENTION

In FIG. 1, there is illustrated a monolithic crystal filter 100 embodying the present invention. The filter includes a monolithic crystal filter element 101, a series impedance designated $Z_a$ 102 and a bridging impedance designated $Z_b$ 103 connected across the monolithic crystal filter element 101 and the series impedance 102. The monolithic crystal filter may be advantageously utilized in a narrow-band radio receiver where it is necessary to have a highly selective filter in the intermediate-frequency (IF) stages. For example, the IF stages of an FM receiver may be tuned to frequencies centered at 10.7 MHz. In the IF stages of an FM receiver, it is very important that the IF signal be filtered symmetrically around the IF center frequency. Significant degradation in the performance of the FM receiver will be produced if the IF passband is asymmetrical about the IF center frequency.

The monolithic crystal filter 100 of FIG. 1 is terminated at the input by input impedance designated $Z_i$ 104 and at the output by output impedance designated $Z_0$ 105. As previously mentioned, the input and output of the monolithic crystal filter 100 may be connected between IF stages. Furthermore, the monolithic crystal filter 100 may be cascaded with another monolithic crystal filter 100 or another monolithic crystal filter element 101. If the monolithic crystal filter 100 is cascaded with another monolithic crystal filter element 101, the cascaded arrangement exhibits a frequency response similar to that illustrated in FIG. 2. The frequency response of FIG. 2 is symmetrically located about a passband center frequency $F_c$, which here is 10.7 MHz or the IF center frequency, and has upper and lower stopbands situated approximately 20 KHz from the center frequency. The cascaded circuit exhibits a response which has a passband of approximately 40 KHz and a stopband attenuation of greater than 50 dB.

Referring to FIG. 1, the monolithic crystal element 101 may be any suitable commercially available monolithic crystal element which has two pairs of electrodes that exhibit substantially identical resonating frequencies. The resonating frequencies of the electrode pairs are preferably located below the passband center frequency. Alternatively, the resonating frequencies of the electrode pairs may also be located above the passband center frequency. The electrodes on one major surface are connected to signal ground and the electrodes on the opposite major surface are arranged such that the first of the electrodes is connected to the series impedance 102 and the second of the electrodes is connected to the bridging impedance 103. The series impedance 102 adapts the frequency of the electrode pair to which it is connected such that the geometric mean, i.e. square root of the product, of the adapted and non-adapted electrode-pair frequencies is substantially the same as the passband center frequency. The bridging impedance 103 is connected across the series impedance 102 and monolithic crystal filter element 101 to provide upper and lower stopbands for attenuating frequencies at the skirts of the filter device.

In FIG. 3, a detailed circuit diagram is illustrated for the generalized circuit diagram of FIG. 1, where circuitry within the dashed lines in FIG. 3 is identified by reference numerals of corresponding blocks of FIG. 1. The output impedance 105 may be generally represented by a capacitor $C_L$ and a resistor $R_L$. The bridging impedance 103 may be a capacitor $C_g$. The monolithic crystal filter element 101 may be replaced by an equivalent circuit model, as is known in the art, where $C_{01}$ and $R_{s1}$, $C_{m1}$ and $L_{m1}$ are substantially identical to $C_{02}$, $R_{s2}$, $C_{m2}$ and $L_{m2}$, respectively. The capacitors $C_{01}$ and $C_{02}$ are termed static capacitances and are the capacitance of the electrode pairs themselves. Considering the monolithic crystal filter element 101 separate from the circuit diagram of FIG. 2 the resonating frequency of the first electrode circuit formed by $R_{s1}$, $C_{m1}$, $L_{m1}$ and $L_{l2}$ is substantially identical to the resonating frequency of the second electrode circuit formed by $R_{s2}$, $C_{m2}$, $L_{m2}$ and $L_{l2}$. The series impedance 102 is added to move the resonating frequency for the first electrode circuit above the resonating frequency of the second electrode circuit.

Since the resonating frequencies of the first and second electrode circuits are below the passband center frequency in the preferred embodiment, the resonating frequency of the first electrode circuit must be raised by the series impedance 102. In order to raise the resonating frequency of the first electrode circuit, the series impedance must be capacitive. Therefore, capacitor $C_a$ is added. In order to realize the improvement in the selectivity characteristic of the monolithic crystal filter resulting from the series impedance 102, the static capacitance $C_{01}$ must be compensated. For relatively narrow filter passbands, where the passband divided by the passband center frequency is less than two tenths of a percent, an inductor $L_0$ can be used to resonate with $C_{01}$ at the passband center frequency. Furthermore, in order to preserve the resonance of the first electrode circuit at the passband center frequency, an inductor $L_a$ is added to the input impedance 104. The resistance $R_s$ of the input impedance 104 is the equivalent series resistance of the preceding stage connected to the input of the monolithic crystal filter. The value of the terminating resistance $R_s$ is dictated by the desired filter selectivity characteristic.

For example, for an intermediate frequency (IF) of approximately 10.7 MHz, the value of the inductor $L_0$ will be relatively large compared to the values of other inductors used throughout the IF section of the receiver. Therefore, impedance transformations may be utilized to transform the inductor $L_0$ to equivalent reactive components having more suitable values. For relatively narrow passbands, the electrical components of the input impedance 104 and the series impedance 102 of FIG. 3 may be transformed by impedance transformations known in the art to the arrangement of electrical components for the input impedance 104 and series impedance 102 of FIG. 4. The frequency response of FIG. 2, having a passband center frequency $F_c = 10.7$ MHz, was obtained by the circuit of FIG. 4 coupled by a total shunt capacitance of 9.6 pF (includes the static capacitance 2.25 pF of each monolithic crystal filter) to another monolithic crystal filter element 101, wherein the following component values were used:

$R_p = 470$ Ohms;
$C_{e1} = 40$ pF;
$C_{e2} = 27$ pF;
$C_{e3} = 27$ pF;
$L_{e1} = 16.3$ uH;
$C_{e4} = 2.7$ pF;
$C_g = 0.75$ pF; and
Crystal 101 = 10.696 MHz electrode frequencies.

We claim:

1. A filter having a predetermined passband symmetrically located about a center frequency, said filter comprising:
   monolithic crystal filter means having first and second pairs of electrodes, the first and second pairs of electrodes having substantially identical predetermined resonating frequencies;
   series impedance means having a first terminal and having a second terminal coupled to one of the first and second pairs of electrodes for adapting the resonating frequency of said one pair of electrodes so that the geometric mean of the adapted and non-adapted electrode pair resonating frequencies is substantially the same as the passband center frequency; and
   bridging impedance means having a first terminal coupled to the non-adapted electrode pair of the monolithic crystal filter means and having a second terminal coupled to the first terminal of the series impedance means for providing predetermined first and second stopbands that are symmetrically located above and below the filter passband, respectively, for attenuating frequencies outside of the filter passband.

2. The filter according to claim 1, wherein the electrode-pair resonating frequencies are below the passband center frequency.

3. The filter according to claim 1, wherein the electrode-pair resonating frequencies are above the filter center frequency.

4. The filter according to claim 1, wherein the series impedance means includes capacitor means.

5. The filter according to claim 1, wherein the bridging impedance means includes capacitor means.

6. The filter according to claim 1, further including mounting means for protecting said filter device from the external environment, said mounting means electrically connected to signal ground.

7. The filter according to claim 1, wherein one electrode of each pair of electrodes of the monolithic crystal filter means is electrically connected to signal ground.

8. The filter according to claim 4, further including series inductor means having a first terminal for providing an input terminal to the filter device, and having a second terminal coupled to the first terminal of the series impedance means.

9. The filter according to claim 8, wherein said series impedance means includes shunt inductor means having a first terminal coupled to the second terminal of the series impedance means and having a second terminal coupled to signal ground.

10. The filter according to claim 9, wherein said series inductor means and said series impedance means are combined by impedance transformations to provide a first capacitor connected between the input terminal of said filter device and signal ground, a second capacitor connected between the input terminal of said filter device and the second terminal of the bridging impedance means, third and fourth capacitors connected in series between the second terminal of the bridging impedance means and said one pair of electrodes, and a first inductor connected between the common junction of the third and fourth capacitors and signal ground.

11. A filter having a predetermined passband symmetrically located about a center frequency, said filter comprising:

first monolithic crystal filter means having first and second pairs of electrodes, the first and second pairs of electrodes having substantially identical predetermined resonating frequencies;

series impedance means having a first terminal, and having a second terminal coupled to one of the first and second pairs of electrodes of the first monolithic crystal filter means for adapting the resonating frequency of said one pair of electrodes so that the geometric mean of the adapted and non-adapted electrode-pair resonating frequencies is substantially the same as the passband center frequency; and bridging impedance means having a first terminal coupled to the non-adapted electrode pair of the first monolithic crystal filter means and having a second terminal coupled to the first terminal of the series impedance means for providing predetermined first and second stopbands that are symmetrically located above and below the filter passband, respectively, for attenuating frequencies outside of the filter passband;

second monolithic crystal filter means having first and second pairs of electrodes having substantially identical predetermined resonating frequencies; and interstage impedance means having a first terminal coupled to the non-adapted electrode pair of the first monolithic crystal filter means and one of the first and second pairs of electrodes of the second monolithic crystal filter means, and having a second terminal coupled to signal ground for intercoupling said first monolithic crystal filter means and said second monolithic crystal filter means.

12. The filter according to claim 11, wherein the electrode-pair resonating frequencies of the first and second monolithic crystal filter means are substantially identical.

13. A monolithic filter having a predetermined passband symmetrically located about a center frequency, said monolithic filter comprising:

a first monolithic crystal filter element having first and second pairs of electrodes having substantially identical predetermined resonating frequencies that are below the passband center frequency, the electrodes on one surface of the monolithic crystal filter element being connected to signal ground, the second electrode-pair providing an output terminal of the monolithic filter;

a series capacitor having a first terminal, and having a second terminal connected to the first electrode pair for raising the resonating frequency of the first electrode pair so that the geometric mean of the raised first and non-raised second electrode-pair resonating frequencies is substantially the same as the passband center frequency;

a shunt inductor connected between the series-capacitor second terminal and signal ground;

a bridging capacitor having a first terminal connected to the second electrode pair and having a second terminal connected to the series-capacitor first terminal for providing predetermined first and second stopbands that are symmetrically located above and below the filter passband, respectively, for attenuating frequencies outside the filter passband; and a series inductor having a first terminal providing an input terminal of the monolithic filter, and a second terminal connected to the series-capacitor first terminal.

14. The monolithic filter according to claim 13, wherein the series inductor, series capacitor and shunt inductor are combined by impedance transformations to provide a first capacitor connected between the filter input terminal and signal ground, a second capacitor connected between the filter input terminal and the bridging-capacitor second terminal, third and fourth capacitors connected in series between the bridging-capacitor second terminal and the first electrode pair, and a first inductor connected between the common junction of the third and fourth capacitors and signal ground.

15. The monolithic filter according to claim 14 further including a second monolithic crystal filter element substantially identical to the first monolithic crystal filter element, and a shunt capacitor, one of the electrode pairs of the second monolithic crystal filter element connected to the second electrode pair of the first monolithic crystal filter element, and the shunt capacitor connected between the common junction of the first and second monolithic crystal filter elements and signal ground.

16. The monolithic filter according to claims 14 or 15, for use in a narrow-band radio receiver, the passband center frequency being the intermediate frequency (IF) of the radio receiver, and the monolithic filter providing symmetrical filtering of the IF signal in the radio receiver.

* * * * *

UNITED STATES PATENT AND TRADEMARK OFFICE
CERTIFICATE OF CORRECTION

PATENT NO. : 4,224,586

DATED : 9-23-80

INVENTOR(S) : ROBERT O. LOVING AND RALPH A. KAMIN

It is certified that error appears in the above—identified patent and that said Letters Patent is hereby corrected as shown below:

Col. 4, line 25, "$Ce_3$" should be -- $C_{e3}$ --.

Signed and Sealed this

Fourteenth Day of April 1981

[SEAL]

Attest:

RENE D. TEGTMEYER

Attesting Officer     Acting Commissioner of Patents and Trademarks